US009924607B2

(12) United States Patent
Kurita et al.

(10) Patent No.: US 9,924,607 B2
(45) Date of Patent: Mar. 20, 2018

(54) ELECTRONIC COMPONENT UNIT

(71) Applicant: Yazaki Corporation, Tokyo (JP)

(72) Inventors: Hirotaka Kurita, Shizuoka (JP);
Hiroki Shiraiwa, Shizuoka (JP);
Pharima Akanitsuk, Shizuoka (JP);
Yasuhiro Tokumasu, Shizuoka (JP)

(73) Assignee: YAZAKI CORPORATION,
Minato-ku, Tokyo (JP)

( * ) Notice: Subject to any disclaimer, the term of this patent is extended or adjusted under 35 U.S.C. 154(b) by 0 days.

(21) Appl. No.: 14/692,251

(22) Filed: Apr. 21, 2015

(65) Prior Publication Data
US 2015/0305181 A1 Oct. 22, 2015

(30) Foreign Application Priority Data

Apr. 21, 2014 (JP) ................................. 2014-087542

(51) Int. Cl.
H05K 7/02 (2006.01)
B60R 16/023 (2006.01)

(52) U.S. Cl.
CPC ......... H05K 7/026 (2013.01); B60R 16/0238 (2013.01)

(58) Field of Classification Search
CPC .................................... H05K 5/0217
USPC ............................ 174/50; 361/648
See application file for complete search history.

(56) References Cited

U.S. PATENT DOCUMENTS

| 4,464,583 A | * | 8/1984 | Holmgren | H01B 9/029 |
| | | | | 174/71 C |
| 2005/0194167 A1 | * | 9/2005 | Kiyota | H02G 3/081 |
| | | | | 174/17 VA |
| 2006/0292903 A1 | | 12/2006 | Kanou | |
| 2009/0163053 A1 | * | 6/2009 | Yamaguchi | H01R 9/2466 |
| | | | | 439/76.1 |

(Continued)

FOREIGN PATENT DOCUMENTS

| CN | 1885650 A | 12/2006 |
| CN | 101032062 A | 9/2007 |
| JP | 63-167326 U | 10/1988 |
| JP | 2013-198347 A | 9/2013 |

OTHER PUBLICATIONS

Communication from the Chinese Patent Office dated Sep. 30, 2016 in corresponding Chinese Patent Application No. 201510188565.1.

(Continued)

Primary Examiner — Hoa C Nguyen
Assistant Examiner — Stanley Tso
(74) Attorney, Agent, or Firm — Sughrue Mion, PLLC

(57) ABSTRACT

An electronic component unit includes a housing. The housing includes a housing space that houses an electronic component. The housing space is divided into a plurality of divided spaces by a central wall-shaped part protruding from a bottom of the housing space. The bottom defines a lower side of the housing space in the vertical direction. The central wall-shaped part has a connecting portion-fitting part to which a connecting part of an electric wire is fitted. For each of the divided spaces, the bottom has a short side direction tilted surface that is tilted from the central wall-shaped part toward the lower side in the vertical direction in a state where the housing is installed at an installation position, and a drain hole formed at a lower end of the short side direction tilted surface in the vertical direction.

6 Claims, 8 Drawing Sheets

(56) References Cited

U.S. PATENT DOCUMENTS

| | | | | |
|---|---|---|---|---|
| 2009/0298311 A1* | 12/2009 | Nakanishi | ............... | H02G 3/088 |
| | | | | 439/76.2 |
| 2010/0307896 A1* | 12/2010 | Nogami | ................. | H01H 9/047 |
| | | | | 200/293 |
| 2012/0239321 A1* | 9/2012 | Normoyle | .............. | H02H 9/042 |
| | | | | 702/58 |
| 2012/0307464 A1* | 12/2012 | Nakanishi | ........... | B60R 16/0238 |
| | | | | 361/752 |
| 2013/0250489 A1* | 9/2013 | Toda | ................... | B60R 16/0238 |
| | | | | 361/648 |
| 2013/0335889 A1* | 12/2013 | Makino | ................ | H05K 5/0239 |
| | | | | 361/641 |
| 2014/0259337 A1* | 9/2014 | Melvin, Jr. | .......... | A47K 13/105 |
| | | | | 4/237 |
| 2015/0137758 A1* | 5/2015 | Taga | ..................... | H02J 7/0045 |
| | | | | 320/112 |

OTHER PUBLICATIONS

Communication dated May 31, 2017 from the State Intellectual Property Office of the P.R.C. in counterpart application No. 201510188565.1.

Communication dated Dec. 4, 2017, from State Intellectual Property Office of the P.R.C. in counterpart application No. 201510188565.1.

Communication dated Jan. 23, 2018 from the Japanese Patent Office in counterpart application No. 2014-087542.

* cited by examiner

LONG SIDE DIRECTION

LONG SIDE DIRECTION

ELECTRONIC COMPONENT UNIT

CROSS-REFERENCE TO RELATED APPLICATIONS

The present application claims priority to and incorporates by reference the entire contents of Japanese Patent Application No. 2014-087542 filed in Japan on Apr. 21, 2014.

BACKGROUND OF THE INVENTION

1. Field of the Invention

The present invention relates to an electronic component unit.

2. Description of the Related Art

An example of conventional electronic component units mounted on vehicles or the like is disclosed in, for example, Japanese Patent Application Laid-open No. 2013-198347 as an electronic component module. The electronic component module includes an electronic component substrate having an insulating plate to which a plurality of bus bars are attached, each of the bus bars having an external terminal connecting part and being electrically connected to an electronic component, a case housing the electronic component substrate therein, and a connector-connecting part in which a plurality of external terminal connecting parts of the plurality of bus bars are collected. The electronic component module includes the connector-connecting part disposed between the multiple electronic components, thereby downsizing the module serving as the electronic component unit.

The electronic component unit described in Japanese Patent Application Laid-open No. 2013-198347 basically has a waterproof structure that prevents water from entering a case (housing), for example. Although, in such a case, various drainage structures that drain water having entered inside are provided in some cases on the assumption that water enters the case due to dew, for example. In such an electronic component unit, a central wall-shaped part projected from a bottom is formed in a housing space of electronic components in the case, and a connecting portion-fitting part to which a connecting part (e.g., a connector) of electric wires is fitted is formed in the central wall-shaped part in some cases. Even in such cases, it is desired that water having entered inside the case is properly drained outside the case.

SUMMARY OF THE INVENTION

In view of the foregoing, the present invention has been made, and an object thereof is to provide an electronic component unit that can properly drain water having entered inside a housing of the electronic component unit outside the housing.

According to one aspect of the present invention, an electronic component unit includes a housing, the housing including a housing space that houses an electronic component therein, a bottom that defines a lower side of the housing space in a vertical direction, a wall-shaped part that protrudes from the bottom and divides the housing space into a plurality of divided spaces, and a connecting portion-fitting part that is formed in the wall-shaped part and to which a connecting part of an electric wire is fitted, wherein for each of the divided spaces, the bottom has a first tilted surface tilted from the wall-shaped part toward the lower side in the vertical direction in a state where the housing is installed at an installation position, and a drain hole formed at a lower end of the first tilted surface in the vertical direction.

According to another aspect of the present invention, it is possible to configure that the drain hole is provided in plurality and the plurality of drain holes are disposed at corners of the bottom.

According to still another aspect of the present invention, it is possible to configure that the bottom has a second tilted surface that is tilted toward the drain hole along a second direction intersecting with a first direction along the direction of the tilt of the first tilted surface.

According to still another aspect of the present invention, it is possible to configure that the bottom has a rising portion that is interposed between the first tilted surface and the second tilted surface, and the first tilted surface is connected to a lower end of the rising portion in the vertical direction while the second tilted surface is connected to an upper end of the rising portion in the vertical direction, and the drain hole is provided in plurality and at least one of the drain hole is formed at a connecting part where the lower end of the first tilted surface in the vertical direction and the rising portion are connected.

According to still another aspect of the present invention, it is possible to configure that the first direction and the second direction are orthogonal to each other, the housing space is divided into the paired divided spaces by the wall-shaped part, the first tilted surface is disposed for each of the paired divided spaces such that the first tilted surfaces are disposed, as a pair, along the first direction on opposite sides of the wall-shaped part and are tilted toward opposite directions, and the second tilted surface is disposed for each of the paired divided spaces such that the second tilted surfaces are disposed, as a pair, along the second direction on opposite sides across the first tilted surface and are tilted toward opposite directions.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENT

The following describes an embodiment according to the present invention in detail with reference to the accompanying drawings. The embodiment does not limit the invention. The constituent elements of the following embodiment include elements that can be easily replaced by persons skilled in the art or that are substantially the same as the elements known by those in the art.

Embodiment

Figure 1:
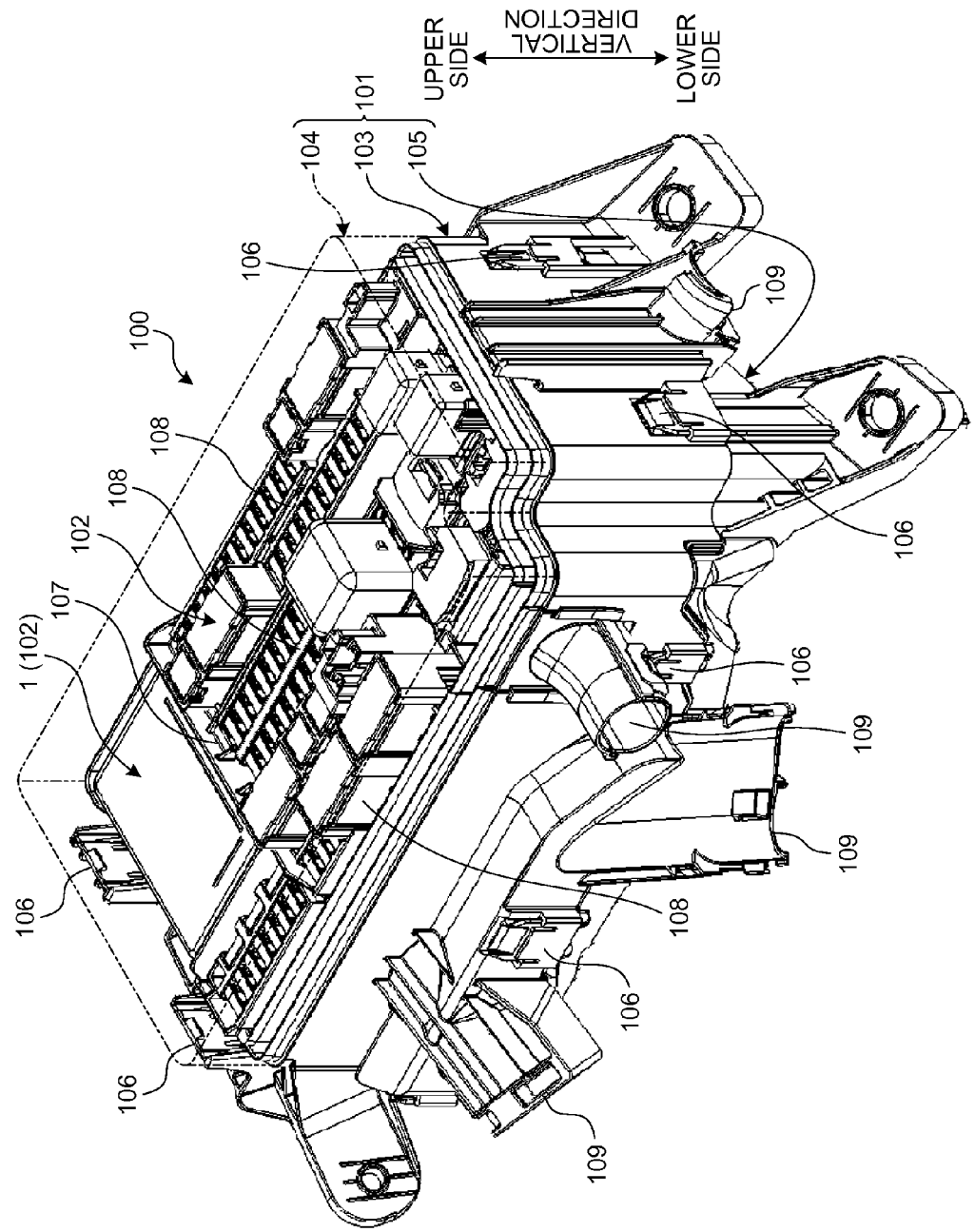
FIG. 1 is a perspective view illustrating a schematic structure of an electrical connection box to which an electronic component unit according to an embodiment of the present invention is applied.
Figure 2:
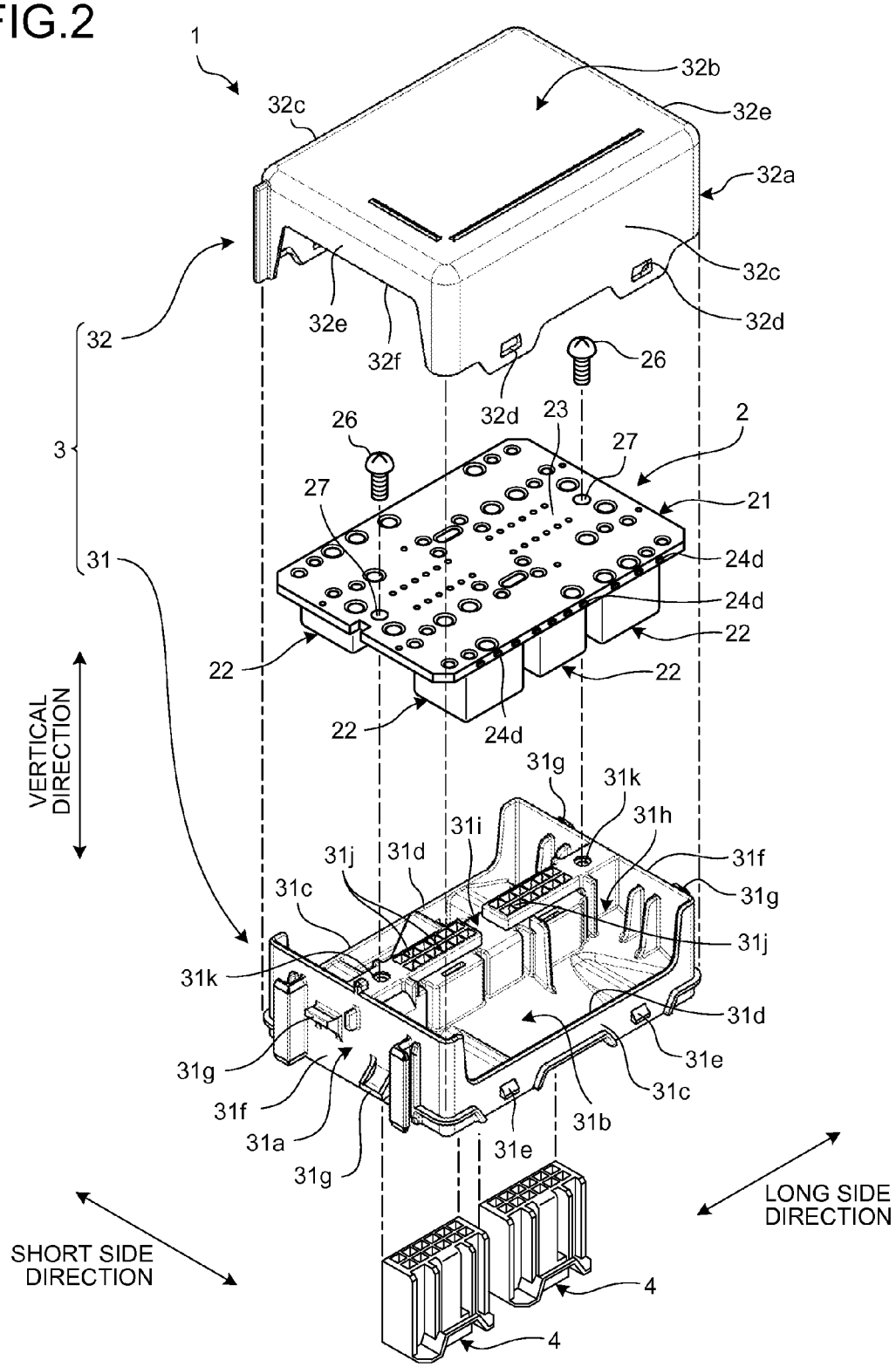
FIG. 2 is an exploded perspective view illustrating a schematic structure of the electronic component unit according to the embodiment.
Figure 3:
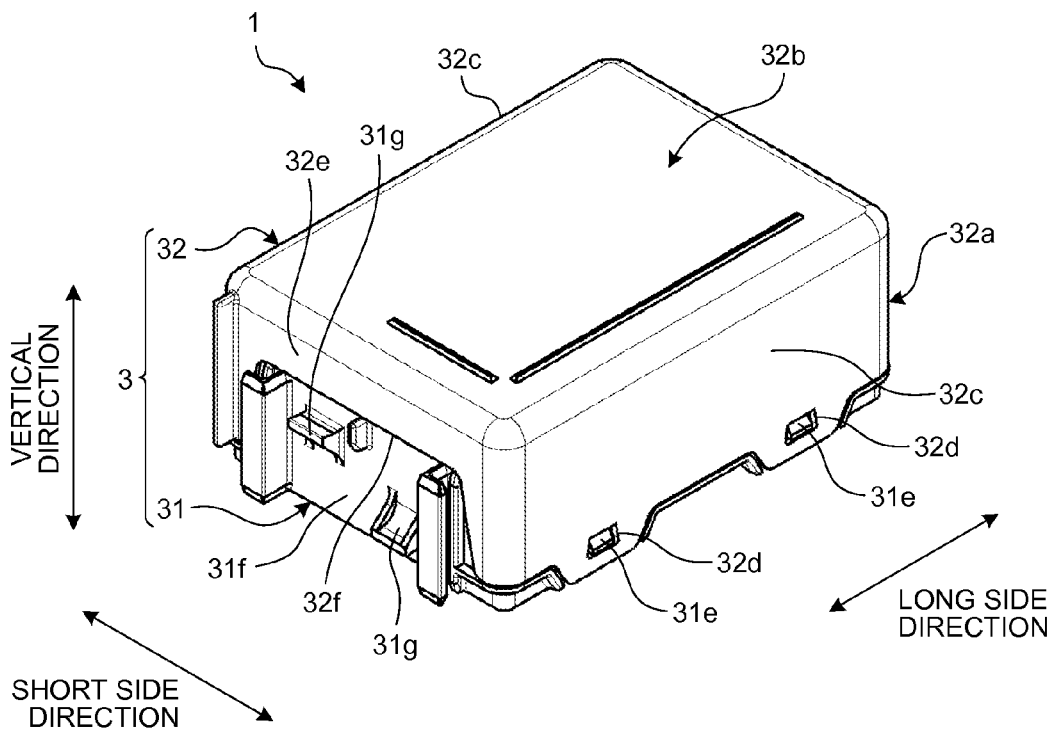
FIG. 3 is a perspective view illustrating the schematic structure of the electronic component unit according to the embodiment.
Figure 4:
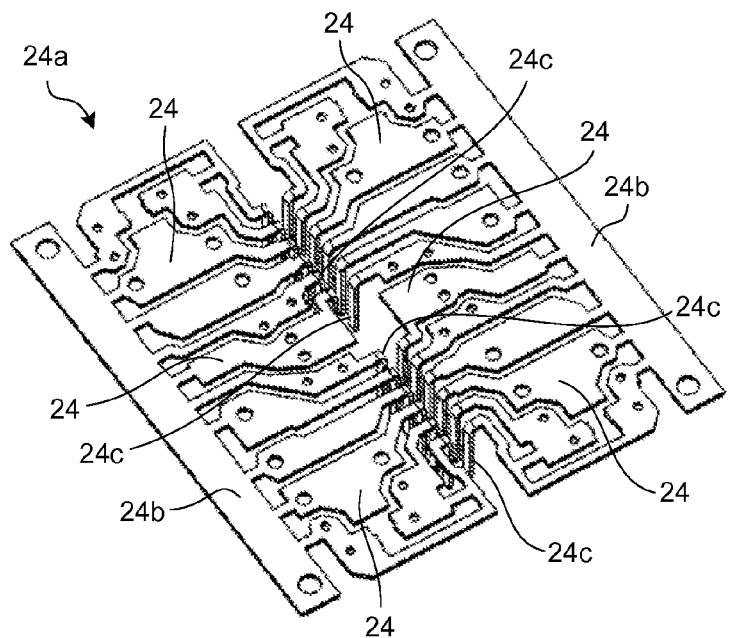
FIG. 4 is a perspective view explaining bus bars of the electronic component unit according to the embodiment.
Figure 5:
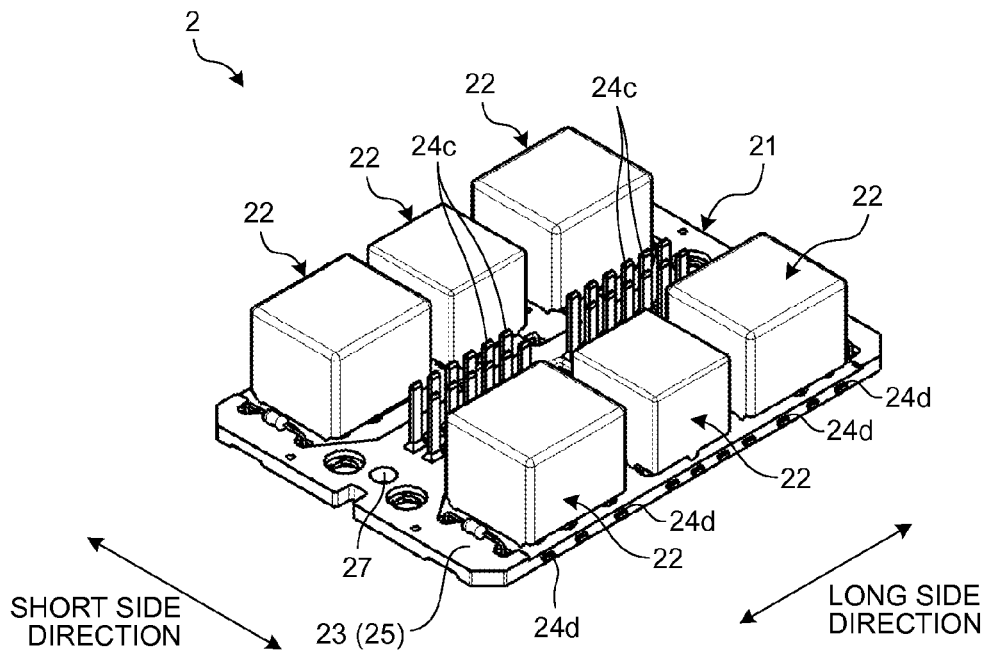
FIG. 5 is a perspective view illustrating a schematic structure of an insert bus bar plate of the electronic component unit according to the embodiment.
Figure 6:
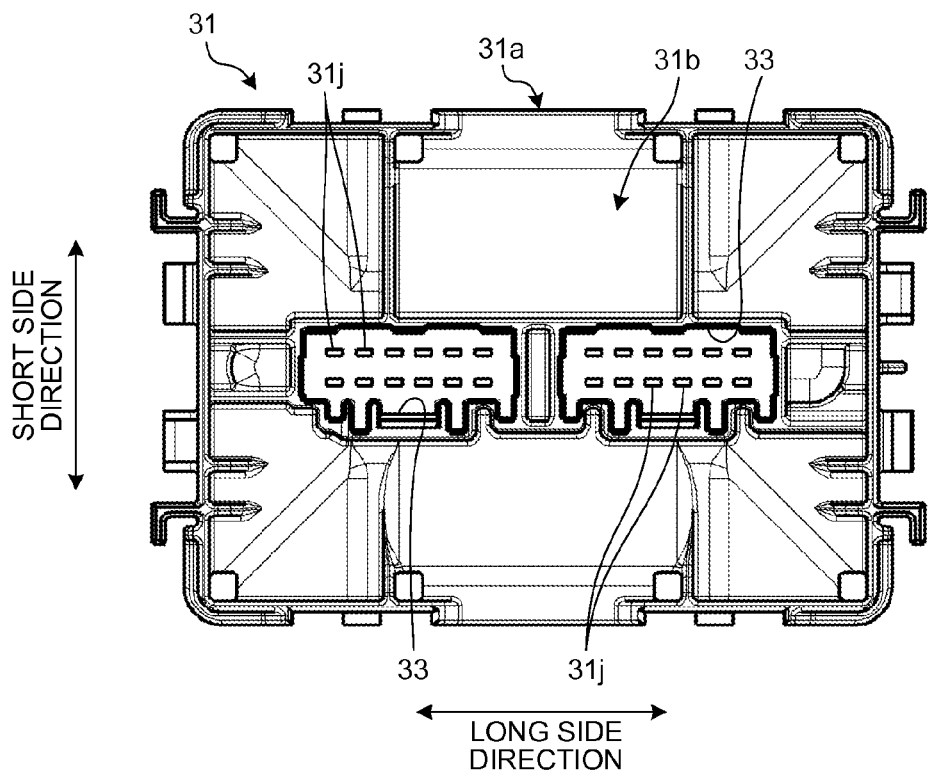
FIG. 6 is a plan view of a base cover of the electronic component unit according to the embodiment viewed from a connector fitting part side.
Figure 7:
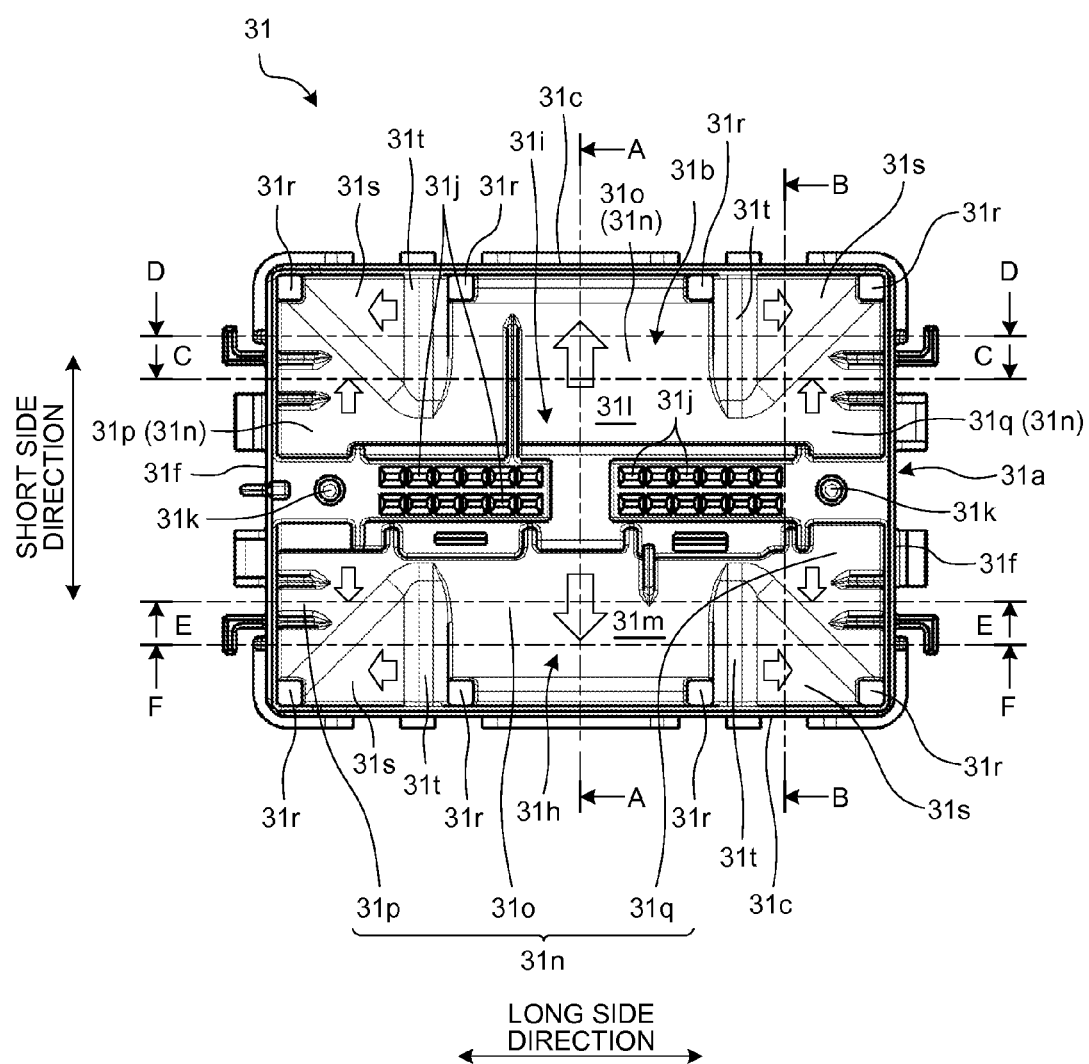
FIG. 7 is a plan view of the base cover of the electronic component unit according to the embodiment viewed from a housing space side.
Figure 8:
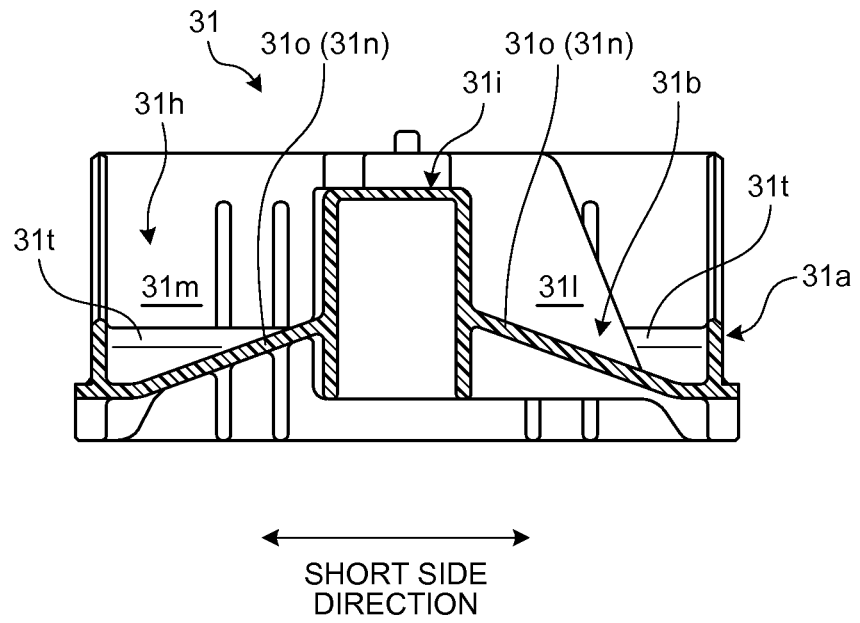
FIG. 8 is a sectional view along line A-A of FIG. 7.
Figure 9:
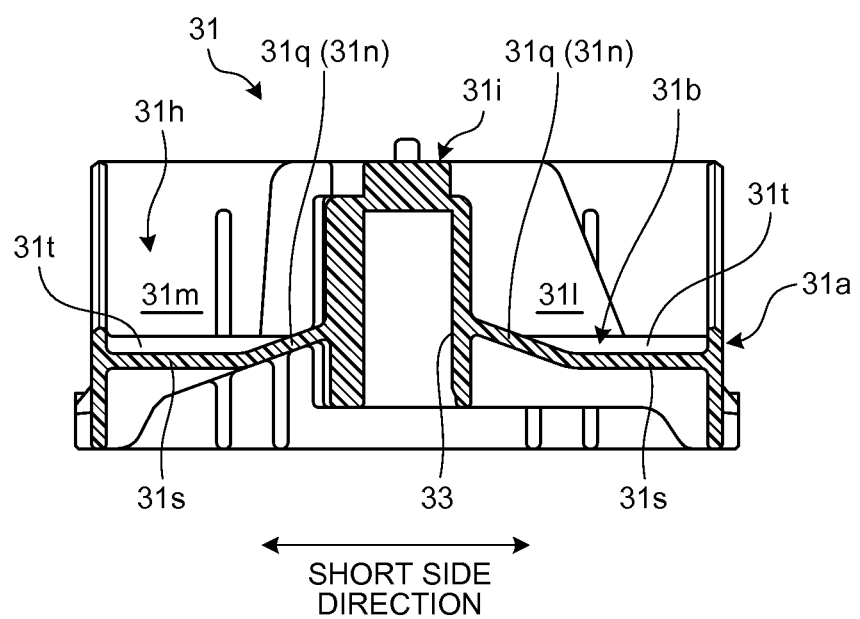
FIG. 9 is a sectional view along line B-B of FIG. 7.
Figure 10:
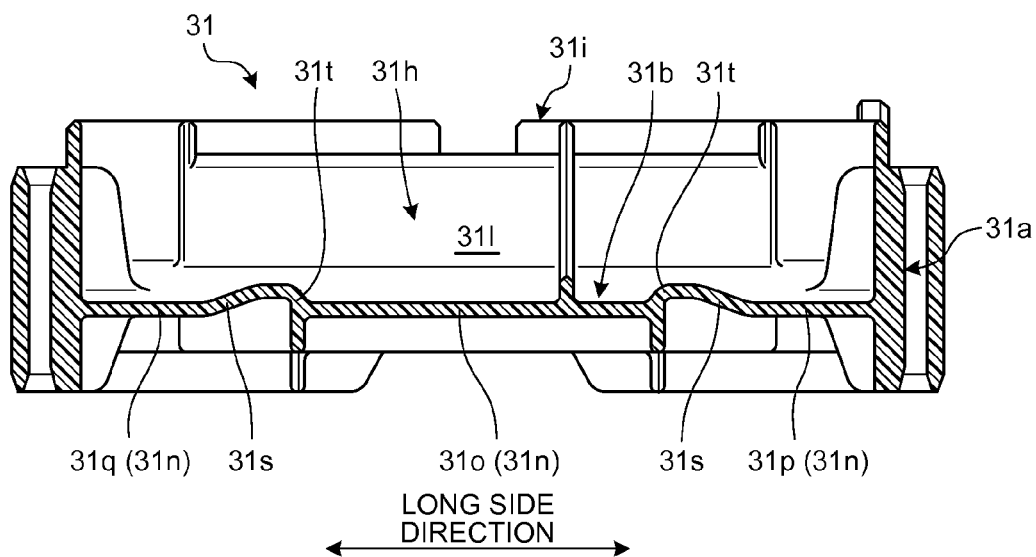
FIG. 10 is a sectional view along line C-C of FIG. 7.
Figure 11:
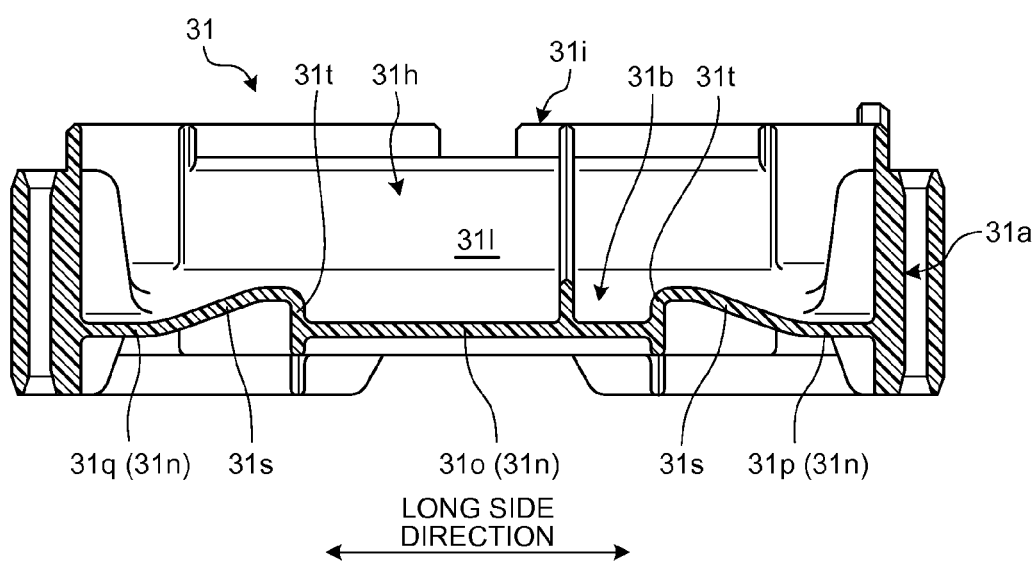
FIG. 11 is a sectional view along line D-D of FIG. 7.
Figure 12:
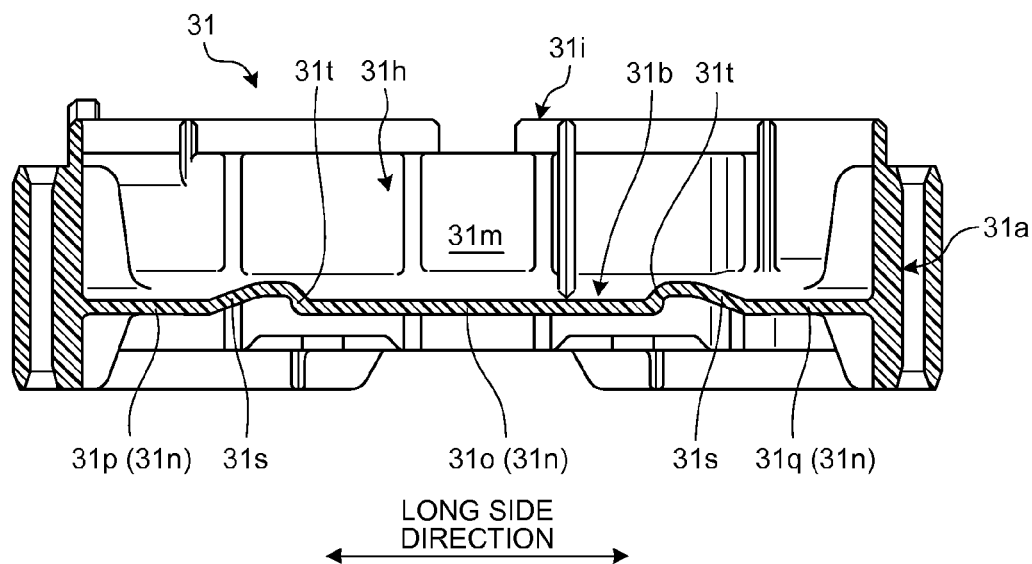
FIG. 12 is a sectional view along line E-E of FIG. 7.
Figure 13:
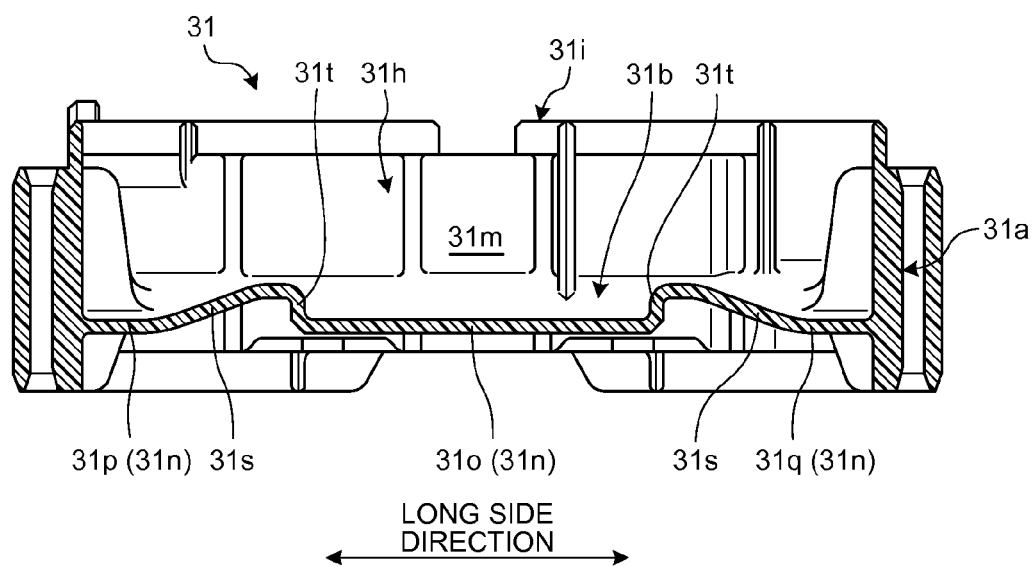
FIG. 13 is a sectional view along line F-F of FIG. 7.

FIG. 1 is a perspective view illustrating a schematic structure of an electrical connection box to which an electronic component unit according to an embodiment is applied. FIG. 2 is an exploded perspective view illustrating a schematic structure of the electronic component unit according to the embodiment. FIG. 3 is a perspective view illustrating the schematic structure of the electronic component unit according to the embodiment. FIG. 4 is a perspective view explaining bus bars of the electronic component unit according to the embodiment. FIG. 5 is a perspective view illustrating a schematic structure of an insert bus bar plate of the electronic component unit according to the embodiment. FIG. 6 is a plan view of a base cover of the electronic component unit according to the embodiment viewed from a connector fitting part side. FIG. 7 is a plan view of the base cover of the electronic component unit according to the embodiment viewed from a housing space side. FIG. 8 is a sectional view along line A-A of FIG. 7. FIG. 9 is a sectional view along line B-B of FIG. 7. FIG. 10 is a sectional view along line C-C of FIG. 7. FIG. 11 is a sectional view along line D-D of FIG. 7. FIG. 12 is a sectional view along line E-E of FIG. 7. FIG. 13 is a sectional view along line F-F of FIG. 7. In FIG. 1, an upper cover of the electrical connection box is illustrated with the alternate long and two short dashes line.

As illustrated in FIG. 1, an electronic component unit 1, which is the electronic component unit according to the embodiment, constitutes an electronic component module that is assembled to an electrical connection box 100 mounted on a vehicle such as an automobile in a detachable manner. The electrical connection box 100 collectively houses therein electrical equipments such as connectors included in connection processing components, such as wire harnesses and electric wires, fuses, relays, branches, and an electronic control unit. The electrical connection box 100 is installed in an engine room of a vehicle or a lower portion of a vehicle body, for example. The electrical connection box 100 is coupled between a power source such as a battery and various electronic devices mounted inside the vehicle. The electrical connection box 100 distributes electric power supplied from the power source to the various electronic devices inside the vehicle. The electrical connection box 100 is sometimes called a junction box, a fuse box, or a relay box, for example. In the embodiment, those boxes are collectively called the electrical connection box.

The electrical connection box 100 exemplarily illustrated in FIG. 1 houses various electronic components 102 in a housing space inside a box main body 101. The box main body 101 includes a body 103, an upper cover 104, and a lower cover 105, for example. The box main body 101 has a three-layer divided structure in which the body 103, the upper cover 104, and the lower cover 105 are stacked. The body 103, the upper cover 104, and the lower cover 105 are formed of an insulating synthetic resin. The body 103 forms most of the housing space to which the electronic components 102 are assembled. The body 103 is formed in an approximately square tube shape. When the electrical connection box 100 is connected to the engine room, for example, one opening of the body 103 is located on the upper side in the vertical direction while the other opening of the body 103 is located on the lower side in the vertical direction. The upper cover 104 is a lid-shaped member that closes the opening of the body 103 on the upper side in the vertical direction. The lower cover 105 is a dish-shaped (tray-shaped) member that closes the opening of the body 103 on the lower side in the vertical direction. The box main body 101 is structured as follows. The upper cover 104 is assembled to the body 103 on the upper side of the body 103 in vertical direction such that the opening on the upper side in the vertical direction of the body 103 and the opening of the upper cover 104 face each other. The lower cover 105 is assembled to the body 103 on the lower side of the body 103 in the vertical direction such that the opening on the lower side in the vertical direction of the body 103 and the opening of the lower cover 105 face each other. In the box main body 101, the upper cover 104 and the lower cover 105 are engaged with the body 103 by various types of engagement mechanisms 106. The direction along which the body 103, the upper cover 104, and the lower cover 105 are stacked is typically along the vertical direction when the electrical connection box 100 is connected to the engine room, for example. The direction along which they are stacked is, however, tilted at a certain angle with respect to the vertical direction depending on the installation circumstances of the electrical connection box 100 in some cases.

The various electronic components 102 assembled to the housing space inside the box main body 101 include the electronic component unit 1 of the embodiment besides the connectors, the fuses, the relays, the branches, and the electronic control unit, which are described above. The electrical connection box 100 includes many cavities formed by partition walls 107 that have various shapes and are integrally formed with the body 103 and blocks 108 that have various shapes and are assembled to the body 103 in a detachable manner. The various electronic components 102 are assembled to the cavities. The partition walls 107 and the blocks 108 are also formed of the same insulating synthetic resin as the body 103 or another insulating synthetic resin, for example. The electrical connection box 100 is provided with openings 109, through which electric wires are routed. The terminals of the electric wires are fitted, from below in the vertical direction, to the cavities to which the various electronic components 102 are assembled, thereby establishing electrical connections.

As illustrated in FIGS. 2 to 7, the electronic component unit 1 in the embodiment includes an insert bus bar plate 2 serving as a plate, a housing 3, connectors 4 serving as a connecting part to electric wires. The insert bus bar plate 2 is assembled inside the housing 3.

As illustrated in FIGS. 2, 4, and 5, the insert bus bar plate 2 is a substrate that includes bus bars 24 made of a metal in a resin material 23a, and on which electronic components 22 are mounted. The insert bus bar plate 2 includes a substrate main body 21 and the electronic components 22.

The substrate main body 21 includes the multiple conductive bus bars 24 inside a resin material 23. In other words, the bus bars 24 are covered with the insulating resin material 23 and insulated from one another. The substrate main body 21 is formed by insert molding, for example. In the insert molding, the bus bars 24 formed of a conductive metal are arranged in a mold and an insulating resin is injected around the bus bars 24, thereby integrating the metal and the resin.

As exemplarily illustrated in FIG. 4, a bus bar assembly before molding 24a is the assembly of the bus bars 24 before insert molding. In the assembly, the multiple bus bars 24 are connected through carriers 24b. The bus bar assembly before molding 24a is formed of a conductive metal and processed by stamping, for example, into an approximately platy shape as a whole. The bus bar assembly before molding 24a is inserted into a mold for insert molding while terminals 24c of the respective bus bars 24 are bent. The substrate main body 21 is formed by injecting an insulating resin around the bus bar assembly before molding 24a inserted in the mold to integrate the respective bus bars 24 and the resin material 23. The carriers 24b are cut off from the substrate main body 21 after the respective bus bars 24 and the resin material 23 are integrally formed. As a result, the substrate main body 21 is formed in a rectangular plate shape as a whole.

As illustrated in FIG. 5, for example, the terminals 24c of the respective bus bars 24 are arranged almost at the center in a short side direction (a first width direction) and side by side along a long side direction (a second width direction orthogonal to the first width direction) on the substrate main body 21 after being formed by the insert molding. The terminals 24c are arranged side by side in two rows along the long side direction. The respective terminals 24c are erected approximately perpendicular to a mounting surface 25 on which the electronic components 22 are mounted of the substrate main body 21. The respective terminals 24c protrude from the mounting surface 25 and extend along the direction orthogonal to the short side and the long side directions. The respective terminals 24c are disposed between the multiple electronic components 22, which are described later, in the short side direction. In other words, the multiple terminals 24c are collectively disposed at the central area of the mounting surface 25. In the respective edge faces on both sides of the substrate main body 21, the ends of the respective bus bars 24, which are connected to the carrier 24b and cut off from the carrier 24b after the insert molding, are exposed as exposed ends 24d from the resin material 23. The insert bus bar plate 2 has the multiple exposed ends 24d, which are the ends of the respective bus bars 24, on its edge surfaces. The exposed ends 24d are formed on the paired edge surfaces of the opposite long sides of the substrate main body 21. The multiple exposed ends 24d are exposed side by side in the long side direction on the edge surfaces of the respective long sides.

The electronic components 22, which are mounted on the mounting surface 25 of the substrate main body 21, are elements that perform various functions. The respective terminals of the electronic component 22 are electrically connected to the corresponding bus bars 24 and fixed on the bottom surface of the mounting surface 25 by soldering, for example. The electronic components 22 in the embodiment are relays, for example. The electronic component unit 1 in the embodiment is, thus, a relay unit module. The insert bus bar plate 2 in the embodiment is provided with six relays serving as the electronic components 22 in total. Specifically, three relays are disposed side by side along the long side direction on each of both sides of the terminals 24c in the short side direction. In other words, the electronic components 22 are arranged in two rows and the multiple terminals 24c are arranged in two rows between the electronic components 22 arranged in the two rows, on the insert bus bar plate 2. The insert bus bar plate 2 in the embodiment basically has a shape that is substantially line-symmetrically with respect to the center line along the long side direction (i.e., the center line in the short side direction) of the substrate main body 21. The terminals 24c and the electronic components 22 are also arranged in substantially line-symmetrically. On the insert bus bar plate 2, other elements such as relay resisters are mounted besides the six relays serving as the electronic components 22.

As illustrated in FIGS. 2, 3, 6, and 7, the housing 3 includes a base cover 31 serving as a base, a top cover 32 serving as a lid, and connector fitting parts 33 serving as a connecting portion-fitting part. To the base cover 31, the insert bus bar plate 2 is assembled. The top cover 32 covers the insert bus bar plate 2 assembled to the base cover 31 from the side opposite the base cover 31. To each of the connector fitting parts 33, the connector 4 is fitted that serves as a portion connecting the terminals 24c of the bus bars 24 and electric wires. The connector fitting parts 33 are integrally formed with the base cover 31. The base cover 31, the top cover 32, and the connector fitting parts 33 are formed of an insulating synthetic resin.

The base cover 31 is specifically a dish-shaped (tray-shaped) member as illustrated in FIG. 2. The base cover 31 includes a rectangular frame part 31a formed in an approximately square shape and a bottom 31b that closes the rectangular frame part 31a. The bottom 31b is formed in a rectangular plate shape similar to the shape of the substrate main body 21 of the insert bus bar plate 2. The rectangular frame part 31a is formed such that it surrounds the outer edge of the bottom 31b. The bottom 31b is formed in a halfway portion in the vertical direction of the rectangular frame part 31a by being integrated with the rectangular frame part 31a (refer to FIGS. 8 and 9). In the rectangular frame part 31a, a notch 31d and engagement claws 31e for engaging with the top cover 32 are formed on each of a pair of long side sidewalls 31c along the long side direction of the bottom 31b. In the rectangular frame part 31a, engagement claws 31g for engaging with the box main body 101 of the electrical connection box 100 are formed on each of a pair of short side sidewalls 31f along the short side direction of the bottom 31b. The base cover 31 is formed in a rectangular tube shape (the notches 31d are partially formed) by the rectangular frame part 31a and the bottom 31b that is disposed in a halfway portion of the rectangular frame part 31a as the closing portion of the tube shape. The space surrounded by the rectangular frame part 31a and the bottom 31b of the base cover 31 is defined as a housing space 31h in which the electronic components 22 of the insert bus bar plate 2 are housed.

The base cover 31 has a central wall-shaped part 31i formed at the central area of the bottom 31b. The central wall-shaped part 31i is formed such that the bottom 31b protrudes on the housing space 31h side. The central wall-shaped part 31i is formed along the long side direction and at almost the center of the bottom 31b in the short side direction. The central wall-shaped part 31i extends from one short side sidewall 31f to the other short side sidewall 31f along the long side direction. In the central wall-shaped part 31i, a plurality of terminal fitting holes 31j and a pair of screw holes 31k are formed on the distal end surface thereof. The terminal fitting holes 31j, to which the terminals 24c of the respective bus bars 24 are fitted when the insert bus bar plate 2 is assembled to the base cover 31, are formed in accordance with the numbers and the arrangement positions of the terminals 24c. The terminal fitting holes 31j are arranged side by side in two rows along the long side direction. Into the screw holes 31k, screws 26 are screwed that fasten the insert bus bar plate 2 to the base cover 31 to assemble the insert bus bar plate 2 to the base cover 31.

As illustrated in FIGS. 6 and 9, the base cover 31 has cavities on the rear surface side of the central wall-shaped part 31i, i.e., on the side opposite the housing space 31h. The cavities serve as the connector fitting parts 33 to each of which the connector 4 serving as the connecting part of the electric wires is fitted. The terminals 24c of the respective bus bar 24 are exposed in the connector fitting parts 33 after passing through the corresponding terminal fitting holes 31j when the insert bus bar plate 2 is assembled to the base cover 31. The connector fitting part 33 is formed at each of two places. The connector 4 is fitted to each of the two connector fitting parts 33, i.e., the two connectors 4 are fitted in total. In the electronic component unit 1 in the embodiment, the two connectors 4 are connected to the terminals 24c of the multiple bus bars 24.

As illustrated in FIG. 2, the top cover 32 is a lid-shaped member. The top cover 32 includes a rectangular frame part 32a formed in an approximately square shape and a ceiling 32b that closes one opening of the rectangular frame part 32a. The ceiling 32b is formed in a rectangular plate shape similar to the shapes of the substrate main body 21 of the insert bus bar plate 2 and the bottom 31b of the base cover 31. The rectangular frame part 32a is formed such that it is erected from the outer edge of the ceiling 32b. In the rectangular frame part 32a, engagement recesses 32d for engaging with the base cover 31 are formed on each of a pair of long side sidewalls 32c along the long side direction of the ceiling 32b. In the rectangular frame part 32a, a notch 32f is formed on each of a pair of short side sidewalls 32e along the short side direction of the ceiling 32b. The top cover 32 is formed by the rectangular frame part 32a and the ceiling 32b in a rectangular tube shape (the notches 32f are partially formed) having one open end and the other close end.

As illustrated in FIGS. 2 and 3, the insert bus bar plate 2 is assembled to the base cover 31, the side opposite the base cover 31 of the insert bus bar plate 2 is covered with the top cover 32, and the connectors 4 are fitted to the connector fitting parts 33. As a result, the electronic component unit 1 is structured as a module.

More specifically, in the electronic component unit 1, the insert bus bar plate 2 is assembled to the base cover 31 in such a positional relation that the electronic components 22 of the insert bus bar plate 2 are housed in the housing space 31h of the base cover 31, i.e., in such a positional relation that the mounting surface 25 (refer to FIG. 5 or the like) on which the electronic components 22 are mounted faces the bottom 31b of the base cover 31. In the electronic component unit 1, when the insert bus bar plate 2 is assembled to the base cover 31, the terminals 24c of the multiple bus bars 24 of the insert bus bar plate 2 are fitted to the corresponding terminal fitting holes 31j of the base cover 31, and the terminals 24c are exposed in the connector fitting parts 33 along the direction orthogonal to the short side and the long side directions. In the electronic component unit 1, the screws 26 are inserted into screw holes 27 of the insert bus bar plate 2 and then screwed into the screw holes 31k of the base cover 31, thereby fastening the insert bus bar plate 2 and the base cover 31. In the electronic component unit 1, three electronic components 22 are located on each of both sides of the central wall-shaped part 31i in the short side direction when the insert bus bar plate 2 is assembled to the base cover 31.

In the electronic component unit 1, the top cover 32 is attached to the base cover 31 and the like in such a positional relation that the top cover 32 covers the insert bus bar plate 2 assembled to the base cover 31 from the side opposite the base cover 31. In the electronic component unit 1, the respective engagement claws 31e of the base cover 31 are engaged with the corresponding engagement recesses 32d of the top cover 32 while the top cover 32 is attached at the appropriate position. As a result, the top cover 32 is assembled to the base cover 31. As illustrated in FIG. 3, for example, in the electronic component unit 1, the rectangular frame part 32a of the top cover 32 is disposed so as to overlap the outside of the rectangular frame part 31a of the base cover 31, and the engagement claws 31g are exposed from the notches 32f of the top cover 32 when the top cover 32 is assembled to the base cover 31. The connectors 4 are fitted to the connector fitting parts 33 along the direction orthogonal to the short side and the long side directions. As a result, the terminals 24c of the multiple bus bars 24 are connected to the connectors 4 and the electronic component unit 1 is assembled at a certain installation position inside the box main body 101 of the electrical connection box 100 with the respective engagement claws 31g.

The direction along which the base cover 31, the insert bus bar plate 2, and the top cover 32 are stacked is along the vertical direction when the electrical connection box 100 is connected to the engine room, for example, in the same manner as the electrical connection box 100 described above. The direction along which they are stacked may be, however, tilted at a certain angle with respect to the vertical direction depending on the installation circumstances of the electrical connection box 100 in some cases.

The electronic component unit 1 in the embodiment basically has a waterproof structure that prevents water from entering the housing 3. Various drainage structures that drain (discharge) water having entered inside are provided on the assumption that water enters the housing 3 due to dew, for example, even though the waterproof structure is provided.

The housing 3 in the embodiment houses the electronic components 22 in the housing space 31h and has divided spaces 31l and 31m divided by the central wall-shaped part 31i serving as the wall-shaped part in the housing space 31h. The central wall-shaped part 31i protrudes from the bottom 31b that defines the lower side of the housing space 31h in the vertical direction, and in which the connector fitting parts 33 are formed to which the connectors 4 serving as a connecting part of electric wires are fitted. The central wall-shaped part 31i is formed at almost the center in the short direction and along the long side direction. The housing space 31h is, thus, divided into the divided spaces 31l and 31m with the central wall-shaped part 31i interposed between the divided spaces 31l and 31m in the short side direction. In the electronic component unit 1 thus structured, depending on the installation angle of the electronic component unit 1, water having entered inside the housing 3 may remain near the central wall-shaped part 31i. For example, when the electronic component unit 1 is installed at such an installation angle that one divided space is located on the lower side in the vertical direction than the other divided space in the short side direction out of the divided spaces 31l and 31m, water having entered inside the housing 3 does not flow over the central wall-shaped part 31i in the divided space located on the upper side in the direction of the tilt of the housing space 31h. As a result, water may remain near the central wall-shaped part 31i.

As illustrated in FIGS. 7, 8, 9, 10, 11, 12, and 13, for example, the electronic component unit 1 in the embodiment is provided with a short side direction tilted surface 31n serving as a first tilted surface and drain holes 31r on the bottom 31b of the housing space 31h for each of the divided spaces 31l and 31m, thereby making it possible to properly drain water having entered inside the housing 3 outside the housing 3. In the following description, the positional relation is described on the basis of a case where the housing 3 is installed at a certain installation position in a vehicle unless otherwise specifically noted.

Specifically, the bottom 31b of the housing space 31h has the short side direction tilted surfaces 31n and the drain holes 31r.

As illustrated in FIGS. 7, 8, and 9, the short side direction tilted surface 31n is tilted from the central wall-shaped part 31i toward the lower side in the vertical direction when the housing 3 is installed at the installation position. The divided spaces 31l and 31m are disposed, as a pair, with the central wall-shaped part 31i interposed therebetween. The short side direction tilted surface 31n is, thus, disposed for each of the divided spaces 31l and 31m. The respective short side direction tilted surfaces 31n are tilted along the first direction as illustrated with the arrows in FIG. 7. In other words, the first direction is along the direction of the tilt of each of the short side direction tilted surfaces 31n, and corresponds to the short side direction. The respective short side direction tilted surfaces 31n are tilted along the short side direction. It can also be said that the respective short side direction tilted surfaces 31n are tilted along the direction intersecting with the central wall-shaped part 31i. Each short side direction tilted surface 31n is tilted from the central wall-shaped part 31i toward the long side sidewall 31c, i.e., from the upper side to the lower side in the vertical direction.

As described above, the housing space 31h is divided into the divided spaces 31l and 31m as a pair by the central wall-shaped part 31i. The short side direction tilted surface 31n is disposed for each of the divided spaces 31l and 31m such that the short side direction tilted surfaces 31n are disposed, as a pair, along the short side direction (first direction) on the opposite sides of the central wall-shaped part 31i interposed therebetween. The short side direction tilted surfaces 31n are tilted toward the opposite directions. The short side direction tilted surfaces 31n disposed in the divided spaces 31l and 31m are formed in an approximately chevron shape in the cross sectional view illustrated in FIG. 8 (cross sectional view along line A-A in FIG. 7), i.e., are formed such that they extend away from the connector fitting part 33 in the short side direction. In each short side direction tilted surface 31n, one end thereof connected to the central wall-shaped part 31i in the short side direction (the end thereof along the central wall-shaped part 31i) is the uppermost end position in the vertical direction while the other end thereof connected to the long side sidewall 31c in the short side direction (the end thereof along the long side sidewall 31c) is the lowermost end position in the vertical direction.

In the embodiment, each short side direction tilted surface 31n is divided into three sections in the long side direction. In each short side direction tilted surface 31n, a central tilted section 31o is located at the center in the long side direction and lateral tilted sections 31p and 31q are located on both sides of the central tilted section 31o. In the electronic component unit 1, long side direction tilted surfaces 31s serving as a second tilted surface, which are described later, are interposed between the lateral tilted section 31p and the central tilted section 31o, and between the lateral tilted section 31q and the central tilted section 31o.

As illustrated in FIG. 7, the drain holes 31r are formed by passing through the bottom 31b at the lower ends of the respective short side direction tilted surfaces 31n in the vertical direction, thereby making it possible to drain water remaining in the housing space 31h outside the housing 3. In other words, the respective short side direction tilted surfaces 31n (and the respective long side direction tilted surfaces 31s described later) are tilted toward the corresponding drain holes 31r. The drain holes 31r are disposed at least at the corners of the bottom 31b. Specifically, at least one drain hole 31r is disposed at each projected corner where the long side sidewall 31c and the short side sidewall 31f meet. Furthermore, two drain holes 31r are disposed between the paired projected corners along the long side sidewall 31c. As a result, four drain holes 31r are disposed along the long side sidewall 31c on the divided space 31l side and four drain holes 31r are disposed along the long side sidewall 31c on the divided space 31m side, i.e., eight drain holes 31r are disposed in total.

As described above, the bottom 31b of the housing space 31h in the embodiment has the long side direction tilted surfaces 31s serving as the second tilted surface.

As illustrated in FIGS. 7, 10, 11, 12, and 13, the respective long side direction tilted surfaces 31s are tilted toward the corresponding drain holes 31r along the second direction intersecting with the first direction (short side direction) along which the respective short side direction tilted surfaces 31n are tilted. Two long side direction tilted surfaces 31s are disposed for each of the divided spaces 31l and 31m, i.e., four long side direction tilted surfaces 31s are disposed in total. The respective long side direction tilted surfaces 31s are tilted along the second direction as illustrated with the arrows in FIG. 7. In other words, the second direction is along the direction of the tilt of each of the long side direction tilted surfaces 31s, and corresponds to the long side direction intersecting with the first direction (short side direction). The respective long side direction tilted surfaces 31s are tilted along the long side direction. It can also be said that the respective long side direction tilted surfaces 31s are tilted along the extending direction of the central wall-shaped part 31i. In the long side direction, one long side direction tilted surface 31s is disposed in a part between the lateral tilted section 31p and the central tilted section 31o while the other long side direction tilted surface 31s is disposed in a part between the lateral tilted section 31q and the central tilted section 31o for each of the divided spaces 31l and 31m. In the long side direction, one long side direction tilted surface 31s is tilted from the central tilted section 31o toward the drain hole 31r on the lateral tilted section 31p side while the other long side direction tilted surface 31s is tilted from the central tilted section 31o toward the drain hole 31r on the lateral tilted section 31q side for each of the divided spaces 31l and 31m. The respective long side direction tilted surfaces 31s are, thus, tilted from the upper side to the lower side in the vertical direction.

The respective long side direction tilted surfaces 31s, and the lateral tilted sections 31p and 31q of the respective short side direction tilted surfaces 31n are formed in an approximately right-angled triangle shape in a plan view. A combination of the long side direction tilted surface 31s and the lateral tilted section 31p forms an approximately rectangular shape. A combination of the long side direction tilted surface 31s and the lateral tilted section 31q also forms an approximately rectangular shape. One long side direction tilted surface 31s is formed on the long side sidewall 31c side by being adjoined to the long side sidewall 31c and extended such that a valley line formed at the part where the long side direction tilted surface 31s and the lateral tilted section 31p of the short side direction tilted surface 31n meet is directed toward the drain hole 31r at the projected corner. The other long side direction tilted surface 31s is formed on the long side sidewall 31c side by being adjoined to the long side sidewall 31c and extended such that a valley line formed at the part where the long side direction tilted surface 31s and the lateral tilted section 31q of the short side direction tilted surface 31n meet is directed toward the drain hole 31r at the projected corner.

The long side direction tilted surface 31s is disposed for each of the paired divided spaces 31l and 31m such that the long side direction tilted surfaces 31s are disposed, as a pair, along the second direction (long side direction) on the opposite sides of the central tilted section 31o, which is interposed therebetween, of the short side direction tilted surface 31n. The paired long side direction tilted surface 31s are tilted toward the opposite directions. The paired long side direction tilted surface 31s, which are disposed in each of the divided spaces 31l and 31m, are formed in an approximately chevron shape along the long side direction in the cross sectional views illustrated in FIGS. 11 and 13 (cross sectional views along line D-D and line F-F in FIG. 7). In each long side direction tilted surface 31s, the end on the central tilted section 31o side in the long side direction is the uppermost end position in the vertical direction while the end on the drain hole 31r side at the projected corner is the lowermost end position in the vertical direction.

As illustrated in FIGS. 7, 8, 9, 10, 11, 12, and 13, the bottom 31b of the housing space 31h in the embodiment has rising portions 31t. The multiple rising portions 31t are disposed such that they correspond to the respective short side direction tilted surfaces 31n and the respective long side direction tilted surfaces 31s. Each rising portion 31t is a stepped section formed by the wall-shaped part erected in the direction orthogonal to the short side and the long side directions. Each rising portion 31t is interposed between the short side direction tilted surface 31n and the long side direction tilted surface 31s. The short side direction tilted surface 31n is connected to the lower end of the rising portion 31t in the vertical direction while the long side direction tilted surface 31s is connected to the upper end of the rising portion 31t in the vertical direction. More specifically, each rising portion 31t is interposed between the central tilted section 31o of the short side direction tilted surface 31n and the long side direction tilted surface 31s. The central tilted section 31o is connected to the lower end of the rising portion 31t in the vertical direction while the long side direction tilted surface 31s is connected to the upper end of the rising portion 31t in the vertical direction. In the bottom 31b of the housing space 31h in the embodiment, with reference to the rising portion 31t as a border, the central tilted section 31o of the short side direction tilted surface 31n is recessed while the long side direction tilted surface 31s is protruded.

Out of the multiple drain holes 31r in the embodiment, at least one drain hole 31r is formed at the connecting part where the lower end in the vertical direction of the short side direction tilted surface 31n and the rising portion 31t are connected for each connecting part. In each of the divided spaces 31l and 31m, two drain holes 31r are disposed along the long side sidewall 31c between the paired projected corners. Each of the drain holes 31r is formed at the connecting part where the lower end in the vertical direction of the short side direction tilted surface 31n and the rising portion 31t are connected. The drain hole 31r is formed at the base end, which is located on the lowermost position in the vertical direction, of each rising portion 31t, i.e., four drain holes 31r are formed in total.

The electronic component unit 1 described above includes the housing 3. The housing 3 includes the housing space 31h that houses the electronic components 22. The housing space 31h is divided into the divided spaces 31l and 31m by the central wall-shaped part 31i. The central wall-shaped part 31i protrudes from the bottom 31b that defines the lower side of the housing space 31h in the vertical direction. In the central wall-shaped part 31i, the connector fitting parts 33 are formed to which the connectors 4 serving as the connecting part of electric wires are fitted. For each of the divided spaces 31l and 31m, the bottom 31b has the short side direction tilted surface 31n that is tilted from the central wall-shaped part 31i toward the lower side in the vertical direction when the housing 3 is installed at the installation position, and the drain holes 31r formed on the lower end in the vertical direction of the short side direction tilted surface 31n.

In the electronic component unit 1, in each of the divided spaces 31l and 31m divided by the central wall-shaped part 31i, protruding from the bottom 31b of the housing space 31h housing the electronic components 22, in the housing space 31h, the short side direction tilted surfaces 31n tilted from the central wall-shaped part 31i toward the lower side in the vertical direction are formed on the bottom 31b in a state where the housing 3 is installed at the installation position. As a result, the electronic component unit 1 can cause water having entered inside the housing space 31h to move by its own weight on the short side direction tilted surfaces 31n in the direction away from the side adjacent to the central wall-shaped part 31i in which the connector fitting parts 33 are formed, and drain water outside the housing 3 from the drain holes 31r disposed at the lower ends in the vertical direction of the short side direction tilted surfaces 31n, which lower ends are at the positions away from the connector fitting parts 33. In the electronic component unit 1, the short side direction tilted surfaces 31n function as a drainage sloop in the divided spaces 31l and 31m located on both sides of the central wall-shaped part 31i, thereby making it possible to more actively guide water having entered inside to the drain holes 31r located away from the connector fitting parts 33. As a result, the electronic component unit 1 can prevent water having entered inside the housing 3 from remaining near the central wall-shaped part 31i on the basis of the installation angle of the electronic component unit 1. For example, even when the electronic component unit 1 is installed at such an installation angle that one divided space is located on the lower side in the vertical direction than the other divided space in the short side direction out of the divided spaces 31l and 31m, the electronic component unit 1 can prevent water having entered inside the housing 3 from remaining near the central wall-shaped part 31i in the divided space located on upper side in the direction of the tilt of the housing space 31h. Consequently, the electronic component unit 1 can properly drain water having entered inside the housing 3 outside the housing 3.

In the electronic component unit 1 described above, the drain holes 31r are disposed at the corners of the bottom 31b. The electronic component unit 1, thus, can drain water having entered inside the housing 3 from the multiple drain holes 31r outside the housing 3 in a distributing manner, thereby making it possible to more properly drain water having entered inside the housing 3 outside the housing 3.

In the electronic component unit 1 described above, the bottom 31b has the long side direction tilted surfaces 31s tilted toward the drain holes 31r along the second direction intersecting with the first direction along which the short side direction tilted surfaces 31n are tilted. The electronic component unit 1 can form the tilted surfaces in various directions by combining the long side direction tilted surfaces 31s and the short side direction tilted surfaces 31n, thereby making it possible to drain water having entered inside the housing 3 from the drain holes 31r outside the housing 3 in a proper distributing manner. As a result, the electronic component unit 1 can more properly drain water having entered inside the housing 3 outside the housing 3. The electronic component unit 1 can form the tilted surfaces in various directions by the long side direction tilted surfaces 31s and the short side direction tilted surfaces 31n, thereby making it possible to properly drain water having entered inside the housing 3 outside the housing 3 on the basis of the installation angle of the electronic component unit 1. For example, even when the electronic component unit 1 is installed at such a tilted angle that one side thereof is located on the lower side in the vertical direction than the other side, the electronic component unit 1 can properly drain water having entered inside the housing 3 outside the housing 3. In other words, the electronic component unit 1 can be installed at more various installation angles. For example, even when the electronic component unit 1 is applied to each of vehicle models in which the installation conditions of the electronic component unit 1 differ from each other, the electronic component unit 1 can properly drain water having entered inside the housing 3 outside the housing 3 without changing any basic structure. The electronic component unit 1, thus, has a wide versatility. The electronic component unit 1 can form the tilted surfaces in various directions by combining the long side direction tilted surfaces 31s and the short side direction tilted surfaces 31n, thereby making it possible to form the bottom 31b included in the base cover 31 of the housing 3 in a polyhedron. As a result, the stiffness of the bottom 31b in the electronic component unit 1 can be increased, thereby making it possible to increase the stiffness of the whole of the housing 3. The structure described above can achieve the increase in drainage property, the increase in stiffness of the housing 3, and the increase in versatility of the electronic component unit 1.

In the electronic component unit 1 described above, the bottom 31b has the rising portions 31t and the multiple drain holes 31r at least one of which is formed at the portion where the lower end in the vertical direction of the short side direction tilted surface 31n and the rising portion 31t are connected. Each rising portion 31t is interposed between the short side direction tilted surface 31n and the long side direction tilted surface 31s. The short side direction tilted surface 31n is connected to the lower end in the vertical direction of the rising portion 31t while the long side direction tilted surface 31s is connected to the upper end in the vertical direction of the rising portion 31t. As a result, the number of positions where the drain holes 31r are disposed, which positions are the base ends of the rising portions 31t, for example, can be relatively increased in the electronic component unit 1. Consequently, the electronic component unit 1 can more properly drain water having entered inside the housing 3 outside the housing 3. The stiffness of the bottom 31b of the electronic component unit 1 can also be increased by the rising portions 31t, thereby making it possible to increase the stiffness of the whole of the housing 3.

In the electronic component unit 1 described above, the first direction and the second direction are orthogonal to each other and the housing space 31h is divided into paired divided spaces 31l and 31m by the central wall-shaped part 31i. The short side direction tilted surface 31n is disposed for each of the paired divided spaces 31l and 31m such that the short side direction tilted surfaces 31n are disposed, as a pair, along the first direction on the opposite sides of the central wall-shaped part 31i interposed therebetween in the paired divided spaces 31l and 31m, and are tilted toward the opposite directions with respect to one another. The long side direction tilted surface 31s is disposed for each of the paired divided spaces 31l and 31m such that the long side direction tilted surfaces 31s are disposed, as a pair, along the second direction on the opposite sides of the short side direction tilted surface 31n interposed therebetween, and are tilted toward the opposite directions with respect to one another. As a result, the bottom 31b of the electronic component unit 1 can be structured by arranging the short side direction tilted surface 31n and the long side direction tilted surfaces 31s in a well-balanced manner in each of the paired divided spaces 31l and 31m. Consequently, the electronic component unit 1 can more properly drain water having entered inside the housing 3 outside the housing 3.

The electronic component unit 1 is described above as the electronic component module assembled to the electrical connection box 100 in a detachable manner. The structure of the electronic component unit 1 is not limited to being assembled to the electrical connection box 100. For example, the structure of the electronic component unit 1 may be applied to the electrical connection box 100 itself.

The electronic component 22 described above is the relay. The electronic component 22 is not limited to the relay, and may be a fuse, for example.

In the embodiment, the first direction (the direction of the tilt of the short side direction tilted surface 31n) and the second direction (the direction of the tilt of the long side direction tilted surface 31s) are orthogonal to each other. The arrangement of the first and the second directions is not limited to this example.

In the embodiment, each rising portion 31t is interposed between the central tilted section 31o of the short side direction tilted surface 31n and the long side direction tilted surface 31s. The central tilted section 31o of the short side direction tilted surface 31n is connected to the lower end of the rising portion 31t in the vertical direction while the long side direction tilted surface 31s is connected to the upper end of the rising portion 31t in the vertical direction. The opposite connecting relation may be applicable. In each rising portion 31t, the long side direction tilted surface 31s may be connected to the lower end of the rising portion 31t in the vertical direction while the central tilted section 31o of the short side direction tilted surface 31n may be connected to the upper end of the rising portion 31t in the vertical direction. In the bottom 31b of the housing space 31h, with reference to the rising portion 31t as a boundary, the central tilted section 31o of the short side direction tilted surface 31n may be protruded while the long side direction tilted surface 31s may be recessed.

The bottom 31b of the housing space 31h may include no long side direction tilted surfaces 31s and rising portions 31t.

In the electronic component unit according to an aspect of the present invention, the first tilted surface is disposed on the bottom of the housing space in each of the divided spaces in the housing space. The housing space is divided by the wall-shaped part formed by projecting from the bottom. The housing space houses the electronic components. The first tilted surface is tilted from the wall-shaped part toward the lower side in the vertical direction in a state where the housing is installed at the installation position. This structure makes it possible for the electronic component unit to cause water having entered inside the housing space to move by its own weight on the first tilted surface in the direction away from the wall-shaped part in which the connecting portion-fitting part is formed. As a result, the electronic component unit can drain water having entered inside the housing space from the drain holes disposed at the lower end of the first tilted surface in the vertical direction outside the housing. In this way, the electronic component unit can cause the first tilted surface to guide water having entered inside the housing to the drain holes disposed away from the connecting portion-fitting part and drain water outside the housing. Consequently, the electronic component unit has an advantageous effect that the electronic component unit can properly drain water having entered inside the housing outside the housing.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electronic component unit comprising:
a housing, the housing including
a housing space that houses an electronic component therein,
a bottom that defines a lower side of the housing space in a vertical direction,
a wall-shaped part that protrudes from the bottom and divides the housing space into a plurality of divided spaces, and
a connecting portion-fitting part that is formed in the wall-shaped part and to which a connecting part of an electric wire is fitted, wherein
for each of the divided spaces, the bottom has a first tilted surface tilted from the wall-shaped part toward the lower side in the vertical direction in a state where the housing is installed at an installation position, and a drain hole formed at a lower end of the first tilted surface in the vertical direction,
the first tilted surface is tilted along a first direction and is divided into three sections in a second direction that intersects with the first direction, the three sections including a central tilted section located at a center in the second direction and lateral tilted sections located on both sides of the central tilted section,
the bottom has a second tilted surface that is tilted toward the drain hole along the second direction and is interposed between the central tilted section and the lateral tilted section,
the second tilted surface is surrounded on opposing sides by the first tilted surface,
the bottom has a rising portion that is interposed between the central tilted section and the second tilted surface,
at least a part of the rising portion extends along with both a side of the central tilted section and a side of the second tilted surface, and
the drain hole is formed at the connecting part where the lower end in the vertical direction of the central tilted section and the rising portion are connected.

2. The electronic component unit according to claim 1, wherein
the drain hole is provided in plurality and the plurality of drain holes are disposed at corners of the bottom.

3. The electronic component unit according to claim 2, wherein
the first direction and the second direction are orthogonal to each other,
the housing space is divided into the paired divided spaces by the wall-shaped part,
the first tilted surface is disposed for each of the paired divided spaces such that the first tilted surfaces are disposed, as a pair, along the first direction on opposite sides of the wall-shaped part and are tilted toward opposite directions, and
the second tilted surface is disposed for each of the paired divided spaces such that the second tilted surfaces are disposed, as a pair, along the second direction on opposite sides across the first tilted surface and are tilted toward opposite directions.

4. The electronic component unit according to claim 1, wherein
the first tilted surface is connected to a lower end of the rising portion in the vertical direction while the second tilted surface is connected to an upper end of the rising portion in the vertical direction, and
the drain hole is provided in plurality and at least one of the drain hole is formed at a connecting part where the lower end of the first tilted surface in the vertical direction and the rising portion are connected.

5. The electronic component unit according to claim 1, wherein
the first direction and the second direction are orthogonal to each other,
the housing space is divided into the paired divided spaces by the wall-shaped part,
the first tilted surface is disposed for each of the paired divided spaces such that the first tilted surfaces are disposed, as a pair, along the first direction on opposite sides of the wall-shaped part and are tilted toward opposite directions, and
the second tilted surface is disposed for each of the paired divided spaces such that the second tilted surfaces are disposed, as a pair, along the second direction on opposite sides across the first tilted surface and are tilted toward opposite directions.

6. The electronic component unit according to claim 1, wherein the second tilted surface is surrounded on opposing sides by the first tilted surface in a horizontal direction perpendicular to the vertical direction.

* * * * *